United States Patent
Covington et al.

(10) Patent No.: US 9,036,308 B2
(45) Date of Patent: May 19, 2015

(54) VARYINIG MORPHOLOGY IN MAGNETIC SENSOR SUB-LAYERS

(75) Inventors: Mark William Covington, Edina, MN (US); Mark Thomas Kief, Lakeville, MN (US); Wonjoon Jung, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/239,010

(22) Filed: Sep. 21, 2011

(65) Prior Publication Data

US 2013/0071692 A1    Mar. 21, 2013

(51) Int. Cl.
| | |
|---|---|
| *G11B 5/39* | (2006.01) |
| *G01R 33/00* | (2006.01) |
| *G01R 33/09* | (2006.01) |
| *G11B 5/31* | (2006.01) |
| *H01F 10/32* | (2006.01) |
| *H01F 10/30* | (2006.01) |
| *H01F 41/30* | (2006.01) |
| *B82Y 40/00* | (2011.01) |

(52) U.S. Cl.
CPC ............ *G11B 5/3932* (2013.01); *G01R 33/093* (2013.01); *G11B 5/3163* (2013.01); *G11B 5/3906* (2013.01); *H01F 10/3254* (2013.01); *H01F 10/30* (2013.01); *H01F 41/303* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 7,035,062 B1 * | 4/2006 | Mao et al. ................ | 360/324.2 |
| 7,061,731 B2 | 6/2006 | Larson et al. | |
| 7,436,637 B2 * | 10/2008 | Pinarbasi ................ | 360/324.11 |
| 8,077,436 B2 * | 12/2011 | Hirata et al. ............ | 360/324.12 |
| 8,130,475 B2 * | 3/2012 | Kawamori et al. ...... | 360/324.12 |
| 2002/0114111 A1 * | 8/2002 | Zhu ............................ | 360/324.1 |
| 2003/0086217 A1 | 5/2003 | Pinarbasi | |
| 2005/0066897 A1 | 3/2005 | Pelhos et al. | |
| 2005/0083613 A1 * | 4/2005 | Yoshikawa et al. ........ | 360/324.1 |
| 2008/0230819 A1 * | 9/2008 | Nguyen et al. ................ | 257/295 |
| 2009/0154009 A1 | 6/2009 | Le | |
| 2009/0237839 A1 | 9/2009 | Hirata et al. | |
| 2009/0262465 A1 | 10/2009 | Hatatani et al. | |
| 2009/0269618 A1 * | 10/2009 | Kamiguchi et al. ....... | 428/811.1 |
| 2010/0118600 A1 * | 5/2010 | Nagase et al. ................ | 365/158 |
| 2011/0032645 A1 | 2/2011 | Noel et al. | |

FOREIGN PATENT DOCUMENTS

| | | |
|---|---|---|
| EP | 0581295 A1 | 2/1994 |
| EP | 0581295 B1 | 6/1999 |
| GB | 2474167 A | 4/2011 |

(Continued)

OTHER PUBLICATIONS

Websters definition of Morphology (printed Jun. 10, 2013).*

(Continued)

*Primary Examiner* — Kevin Bernatz
(74) *Attorney, Agent, or Firm* — Hall Estill Attorneys at Law

(57) ABSTRACT

Various embodiments may be generally directed to a magnetic sensor constructed with a decoupling layer that has a predetermined first morphology. A magnetic free layer can be deposited contactingly adjacent to the decoupling layer with the magnetic free layer configured to have at least a first sub-layer having a predetermined second morphology.

20 Claims, 4 Drawing Sheets

(56) References Cited

FOREIGN PATENT DOCUMENTS

| | | |
|---|---|---|
| JP | 59-060725 | 4/1984 |
| JP | 59060725 A | 4/1984 |
| JP | 59-107417 | 6/1984 |
| JP | 59107417 A | 6/1987 |
| JP | 2007-525005 A | 8/2007 |
| JP | 2009-032383 A | 2/2009 |
| WO | 2005/006450 A1 | 1/2005 |

OTHER PUBLICATIONS

European Search Report dated Jan. 14, 2013.

* cited by examiner

VARYINIG MORPHOLOGY IN MAGNETIC SENSOR SUB-LAYERS

SUMMARY

A magnetic sensor can be constructed with a decoupling layer that has a predetermined first morphology. A magnetic free layer may be deposited contactingly adjacent to the decoupling layer with the magnetic free layer configured with at least a first sub-layer having a predetermined second morphology.

DETAILED DESCRIPTION

A magnetic sensor with enhanced data sensing performance with variable morphologies is generally disclosed to meet heightened industry demand for larger data capacity and faster data transfer rates. Increasing data capacity may correspond to reduced form factors of various data storage components, such as read elements and shields. Such smaller magnetic components may have magnetic stability difficulties, particularly with precise shield-to-shield spacing criteria that can be demanded in high linear data density applications. Therefore, construction of reduced form factor magnetic sensor that can maintain magnetic orientation and sensitivity of a read element to enhance data sensing performance is in increasing demand in the industry.

Such industry demand may be met by constructing a magnetic sensor with a decoupling layer contactingly adjacent a magnetic free layer that has first and second sub-layers that each have a morphology that differs from a morphology of the decoupling layer. The use of varying morphologies may provide elevated control of operational magnetizations of a magnetic stack that are influenced by pinned biasing magnetization. Particularly in reduced form factor magnetic sensors, the ability to tune the various morphologies to elevate magnetization control can enhance data sensing by reducing magnetization asymmetry while improving magnetic stabilization and data signal amplitude.

Figure 1:
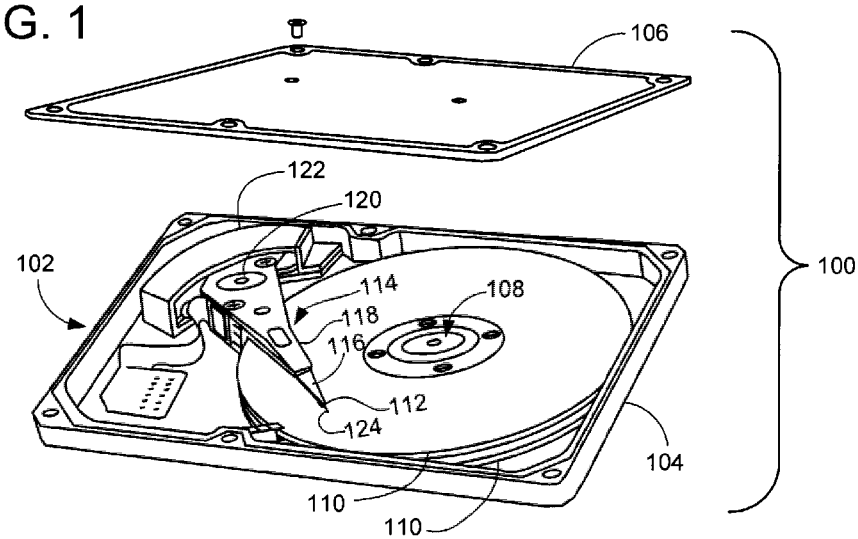
FIG. 1 is a perspective view of an example data storage device.

An exploded view of an embodiment of a data storage device 100 is generally provided in FIG. 1 in a non-limiting environment in which various embodiments of the present invention can be practiced. The device 100 includes a substantially sealed housing 102 formed from a base deck 104 and top cover 106. An internally disposed spindle motor 108 is configured to rotate a number of magnetic storage media 110. The media 110 are accessed by a corresponding array of data transducers (read/write heads) that are each supported by a head gimbal assembly (HGA) 112.

Each HGA 112 can be supported by a head-stack assembly 114 ("actuator") that includes a flexible suspension 116, which in turn is supported by a rigid actuator arm 118. The actuator 114 may pivot about a cartridge bearing assembly 120 through application of current to a voice coil motor (VCM) 122. In this way, controlled operation of the VCM 122 causes the transducers (numerically denoted at 124) to align with tracks (not shown) defined on the media surfaces to store data thereto or retrieve data therefrom.

Figure 2A:
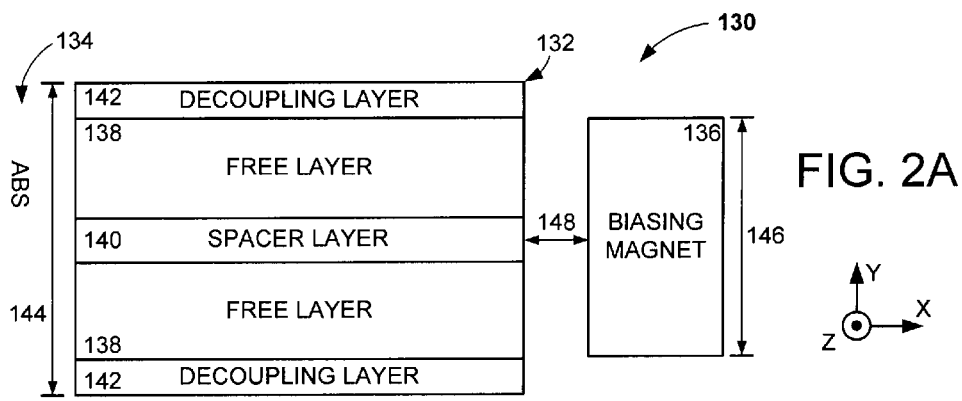
FIGS. 2A and 2B show various views of an example magnetic sensor capable of being used in various embodiments.
Figure 2B:
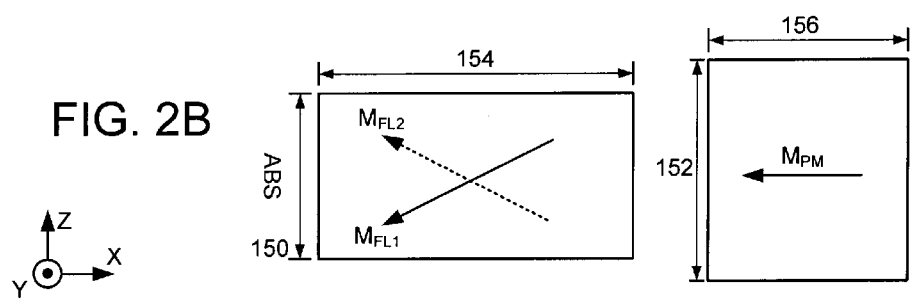

FIGS. 2A and 2B display cross-section and top views, respectively, of block representations of an example magnetic sensor 130 capable of being used in various embodiments. The sensor 130 may be constructed with a magnetic stack 132 disposed between an air bearing surface 134 (ABS) and a rear biasing magnet 136. FIG. 2A illustrates how the magnetic stack 132 can be configured with a pair of magnetic free layers 138 separated by a non-magnetic spacer layer 140. The magnetic sensitivity of each free layer 138 can be tempered with decoupling layers 142 that can inhibit magnetic interference from reaching or escaping from the free layers 138 to an adjacent component, such as a magnetic shield.

With the presence of magnetic free layers 138 without a fixed magnetization in the magnetic stack 132 to be used as a reference, the stack 132 can be characterized as a trilayer read element due to the dual free layers 138 and the spacer layer 140. Such a trilayer read element may utilize the rear biasing magnet 136 to impart a magnetic bias force on the free layers 138 and set a default magnetization, which allows accurate sensing of data bits across the ABS 134 in the absence of a pinned magnetization in the magnetic stack 132. While a trilayer read element is displayed in the magnetic stack 132, construction of the stack 132 is not limited to such a configuration and can be a lamination of any number and type of layers with any magnetic orientation that is magnetically responsive.

In various embodiments that may or may not include a trilayer read element, the magnetic sensor 130 may be tuned to operate with predetermined performance characteristics, such as signal amplitude and asymmetry, to sense data bits while minimizing the shield-to-shield spacing (SSS) 144 of the sensor 130. The magnetic sensor 130 can further be tuned by adjusting the dimensions and magnetizations of the stack 132 and biasing magnet 136, as displayed in top view of FIG. 2B.

A biasing magnet thickness 146 and biasing distance 148 from the stack 132 can be adjusted to provide a predetermined amount of magnetic influence on the free layers 138, which may correspond to enhanced magnetization rotation and data sensing operation for the stack 132. Along with the biasing distance 148, the respective stack and biasing magnet widths 150 and 152, as measured parallel to the ABS along the Z axis, can be tuned to be similar or dissimilar and to correspond to respective stack and biasing magnet stripe heights 154 and 156. The width and stripe heights of the stack 132 and biasing magnet 136 can be tuned to provide a $M_{PM}$ magnetization of predetermined strength and angular orientation that influences the respective magnetic free layers 138 of the stack 132 to predetermined default magnetization configurations, $M_{FL1}$ and $M_{FL2}$.

As such, the various dimensions, thicknesses, and magnetic orientations of the stack 132 and biasing magnet 136 can allow for adjustment and optimization to accommodate any number of predetermined operational and environmental conditions while maintaining a reduced form factor. However, accurate biasing of the stack 132, particularly reduced form factor stacks that include trilayer read elements, may be problematic as the free layers 138 lack direct contact to a set magnetization, such as $M_{PM}$.

Figure 3:
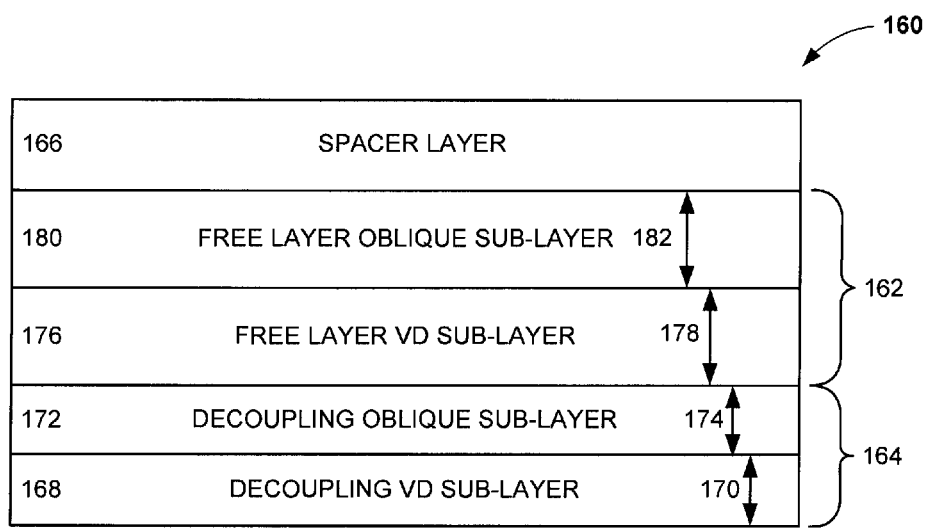
FIG. 3 displays a portion of an example magnetic sensor constructed and operated in accordance with various embodiments.

Accordingly, magnetic orientation and operation of the free layers 138 can be enhanced by tuning the morphologies of the stack 132 and biasing magnet 136 to augment the biasing magnetization provided by the biasing magnet 136. FIG. 3 shows a cross-sectional block representation of a portion of an example magnetic stack 160 capable of being used in various embodiments. The stack 160 is constructed much like stack 132 of FIG. 2A with a magnetic free layer 162 disposed between and directly contacting a decoupling layer 164 and a non-magnetic spacer layer 166.

The configuration of the various layers in the stack 160 is not limited to a particular design, but various embodiments combine a vapor deposited sub-layer, such as physical or chemical vapor deposition, with an obliquely deposited sub-layer to precisely control and tune morphology, which can reinforce the free layer 162 magnetization along predetermined default uniaxial directions, as displayed in FIG. 2B. Such a configuration is displayed both in the decoupling layer 164 and the free layer 162 to allow individual morphologies that can correspond to unique predetermined magnetization behavior.

As shown, the decoupling layer 164 has a decoupling VD sub-layer 168 that is deposited with a vapor deposition process that results in a predetermined first thickness 170. An oblique deposition process can then be undertaken to form the decoupling oblique sub-layer 172 with a predetermined second thickness 174 and designed morphology that differs from the decoupling VD sub-layer 168. The combination of vapor and oblique deposition in subsequent sub-layers 168 and 172 can provide precise tuning of the overall morphology direction and strength in the magnetic layer. That is, the morphology of the entire decoupling layer 164 can be finely adjusted by tuning the material composition, such as MgO, deposition method, and thicknesses 170 and 174 of each sub-layer 168 and 172 to provide an overall morphology.

While not required or limited, the magnetic free layer 162 can also be formed with a free layer VD sub-layer 176 having a predetermined third thickness 178 directly coupled to a free layer oblique sub-layer 180 that has a predetermined fourth thickness 182. Much like the configurations of the decoupling sub-layers 168 and 172, the free layer sub-layers 176 and 180 can have tuned thicknesses 178 and 182 that correspond with anisotropy directions and strengths that differ, but complement one another to provide enhanced magnetization retention and rotation in the presence of a sensed data bit. Of note, but not limiting in any way, the order of the oblique deposition and standard deposition can be interchanged so that the obliquely deposited sub-layer 180 is contactingly adjacent the obliquely deposited decoupling sub-layer 172.

Figure 4:
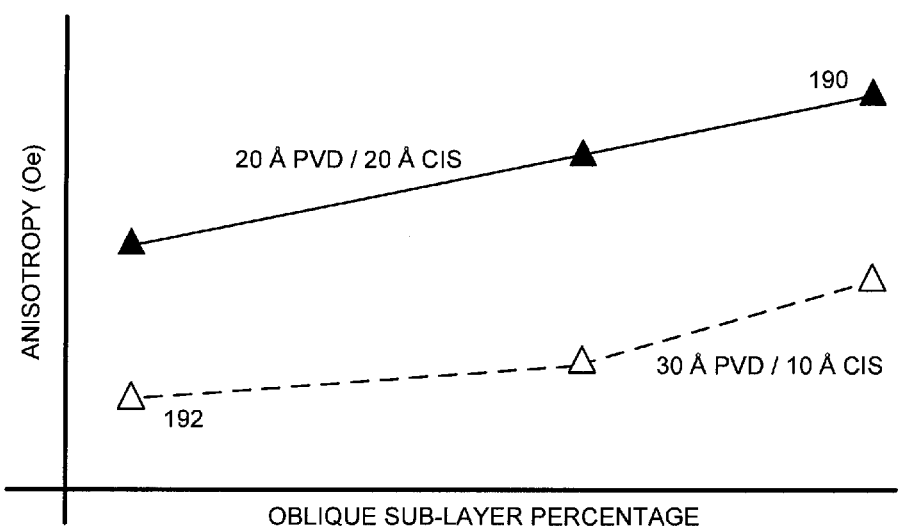
FIG. 4 plots operational characteristics of various magnetic sensor embodiments.

FIG. 4 graphs morphologic behavior of example magnetic stacks having tuned oblique sub-layer percentage, which may correspond to the ratio of an obliquely deposited sub-layer thickness to an orthogonally deposited sub-layer thickness. Solid line 190 illustrates how overall morphology of a magnetic free layer can be tuned by adjusting not only the thickness of free layer sub-layers, but with the thicknesses of the decoupling sub-layers, such as sub-layer thicknesses 170 and 174 of FIG. 3, which is displayed as a 20 Å physical vapor deposition sub-layer thickness and a 20 Å controlled incidence sputtering (CIS) sub-layer thickness.

Similarly, segmented line 192 displays the morphologic behavior of a magnetic free layer with varying thickness formed of a predetermined material, such as a CoFeB alloy, atop a decoupling layer having a 30 Å physical vapor deposition sub-layer thickness and a 10 Å controlled incidence sputtering (CIS) sub-layer thickness. While a higher anisotropy strength may be obtained by solely forming the magnetic free layer with CIS, the ability to tune the morphology by successively depositing sub-layers with different morphologic strengths allows for a magnetic stack to be optimized for a wide variety of environmental and performance characteristics, such as high signal amplitude and magnetization stabilization.

The tuning and optimization of various aspects of a magnetic sensor are not limited to deposition techniques and thicknesses as a number of characteristics can further be adjusted to enhance sensor performance. One such characteristic is the deposition angle used for oblique deposition sub-layers, which may vary in some embodiments between 60° and 75° to provide predetermined morphology anisotropy strength. Another deposition characteristic that can be tuned and optimized is the direction of incident oblique flux with respect to an underlying substrate (i.e. wafer fiducials) that can set the direction of the induced morphology with a predetermined plane of the substrate.

Various embodiments can vary the sub-layer ordering, such as the oblique deposition of a sub-layer prior to the vapor deposited sub-layer, to control sensor operation and performance. Such variety of deposition characteristics and configurations that can be tuned may provide specific biasing magnetization schemes adapted to predetermined structural (form factor) and operational (sensing accuracy) criteria.

Figure 5:
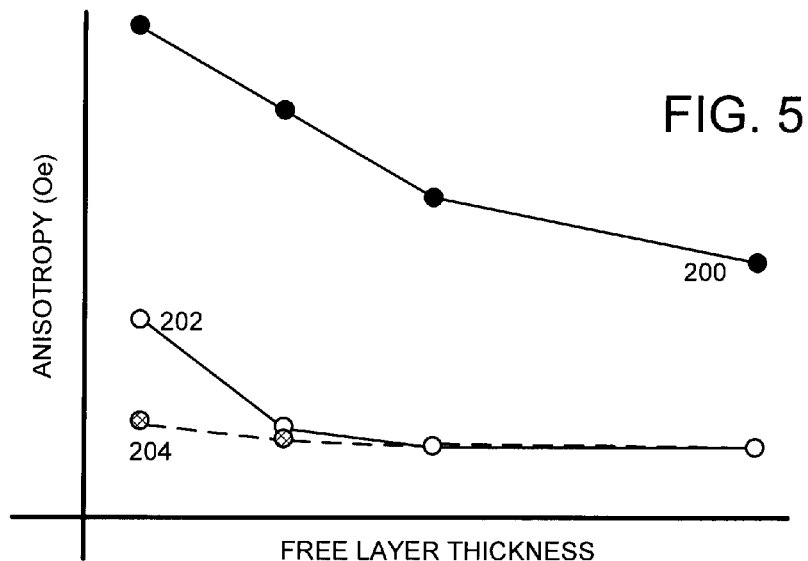
FIG. 5 graphs operational characteristics of magnetic sensors tuned in accordance with various embodiments.

FIG. 5 shows example configurations resultant to tuning of various aspects of a magnetic stack in accordance with various embodiments. Solid dots connected by solid line 200 illustrate how magnetic free layer thickness can affect a magnetic free layer sub-layer configuration tuned with an obliquely deposited decoupling layer made of Tantalum. In contrast, the solid line 202 that connects hollow dots indicates the morphologic behavior of a magnetic free layer configuration tuned with a $SiO_2$ decoupling sub-layer. Finally, segmented line 204 corresponds to a Tantalum decoupling sub-layer having an 8 nm thickness.

It can be appreciated that the wide range of magnetic free layer thicknesses and anisotropy strengths can be utilized in a variety of different magnetic sensor configurations to provide optimized performance tuned specifically for various predetermined applications. However, the utilization of tuned sub-layers is not restricted to portions of the magnetic stack as the biasing magnet as well as leading, trailing, and side shields can likewise be formed with sub-layers that provide optimized biasing magnetization and enhanced data sensing performance.

Figure 6:
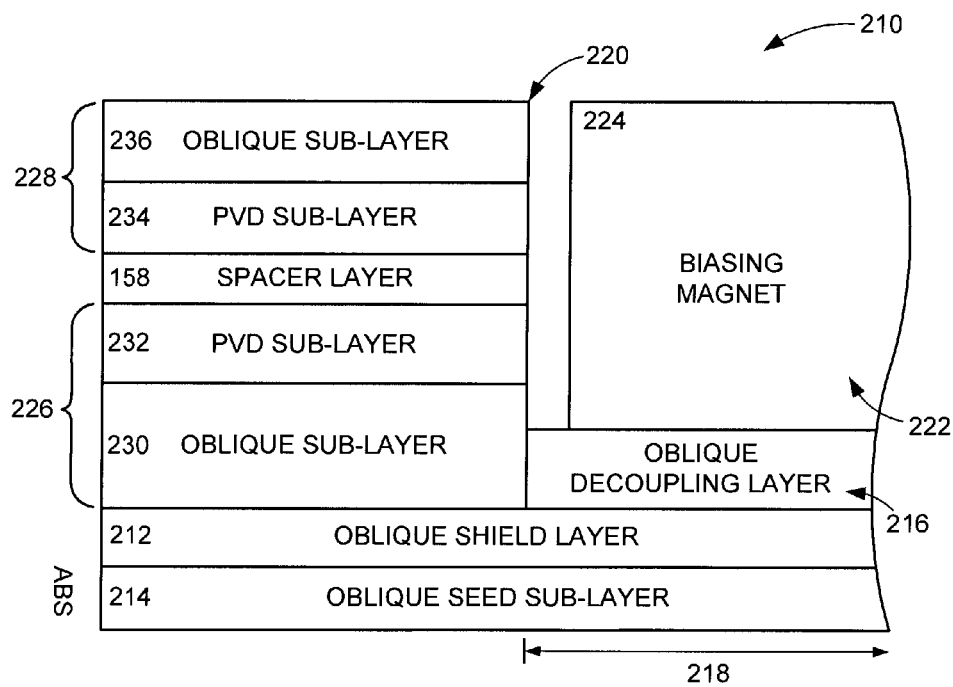
FIG. 6 generally illustrates a portion of an example magnetic sensor capable of being used in various embodiments.

FIG. 6 generally illustrates a block representation of a cross-sectional view of a portion of an example magnetic sensor 210 that has a magnetic shield layer 212 deposited on an obliquely deposited seed sub-layer 214. The oblique depositions of the seed sub-layer 214 and shield layer 212 can be tuned with similar or dissimilar morphologies, which can be tuned by controlling the oblique angle of deposition, to provide enhanced magnetic stability for the shield layer 212 as the morphologies promote tight magnetization dispersion throughout the shield layer 212.

An obliquely deposited decoupling layer 216 is subsequently formed on the shield layer 212 with a predetermined stripe height 218 that can extend to any length along the sensor's stripe height 219. However, in the exemplary embodiment shown in FIG. 6, the stripe height 218 is distal to and separated from the ABS past the magnetic stack 220 at the rear biasing region 222 of the magnetic sensor 210 where the biasing magnet 224 can then be formed to utilize the predetermined morphology of the decoupling layer 216 to promote magnetic stability and consistent bias magnetization. Regardless of the strength or direction of the morphology of the biasing magnet 224, deposition onto the decoupling layer 216 may provide improved magnetic stability in part due to the direct coupling therebetween.

As discussed above, a magnetic stack 220 can be formed onto the decoupling layer 216 to likewise utilize the benefits associated with the morphology of the decoupling layer 216. In the magnetic stack configuration shown in FIG. 6, first and second magnetic free layers 226 and 228 are constructed with different sub-layer deposition orders that can tune magnetic sensor 210 performance by controlling the influence of the biasing magnet on default magnetizations of each free layer 226 and 228.

Specifically, the first magnetic free layer 226 has an obliquely deposited sub-layer 230 disposed between the decoupling layer 216 and a vapor deposited sub-layer 232 while the second magnetic free layer 228 has the opposite orientation as a vapor deposited sub-layer contacts both the non-magnetic spacer layer 234 and an obliquely deposited sub-layer 236. The various layer configurations shown in FIG. 6 can be individually or collectively deposited and tuned with predetermined morphologies that are arranged in various directions and range in strength from negligible to substantial, but form a cohesive magnetic sensor that exhibits optimized magnetic stability that may correspond with enhanced data sensing performance.

Figure 7:
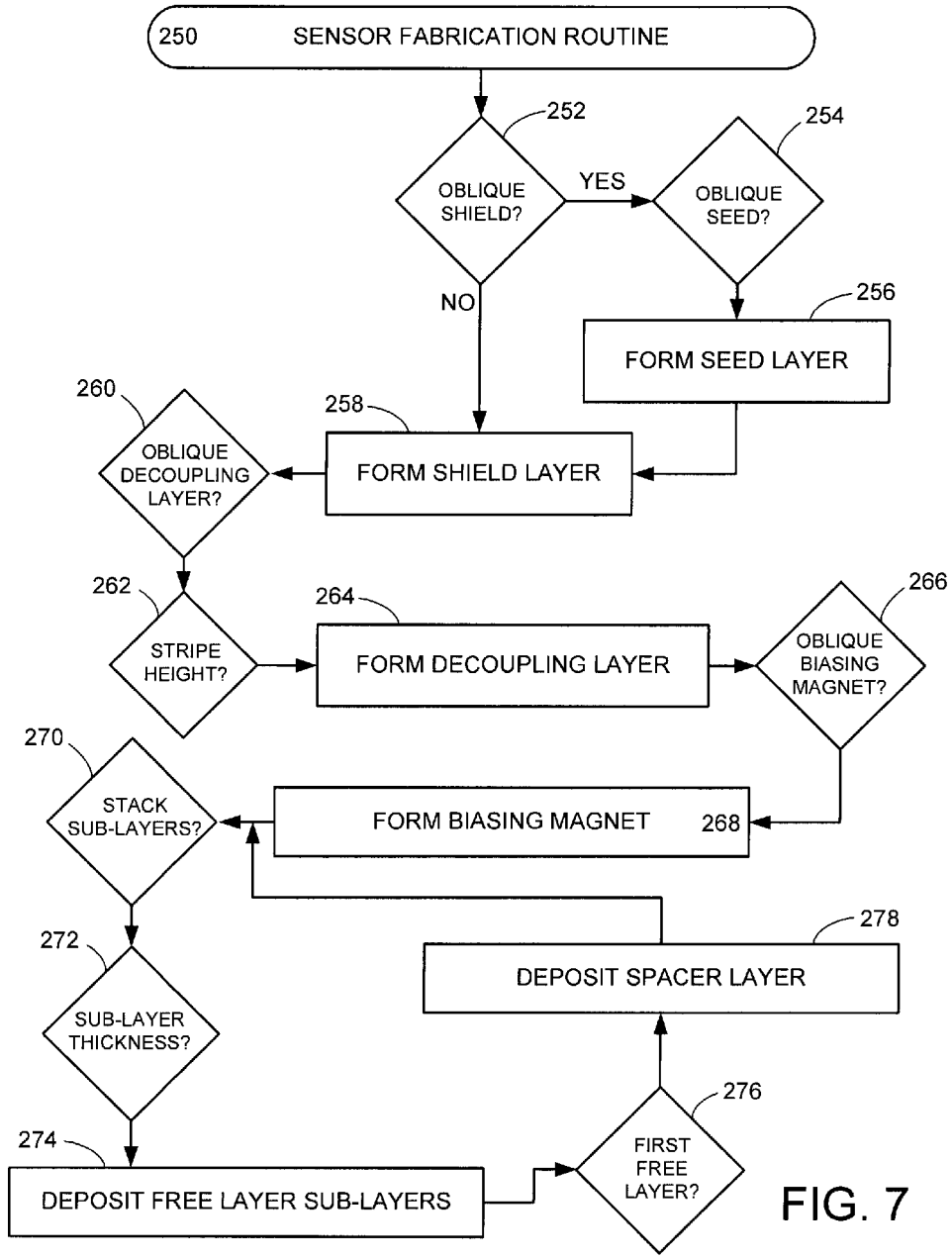
FIG. 7 provides a flowchart of a sensor fabrication routine carried out in accordance with various embodiments of the present invention.

FIG. 7 provides an example flowchart of a sensor fabrication routine 250 conducted in accordance with various embodiments to tune various portions of a magnetic sensor to provide predetermined optimized performance and a predetermined tunneling magnetoresistive ratio between the free layers of the magnetic stack. The routine 250 begins by evaluating whether an oblique magnetic shield is to be included in the magnetic sensor in decision 252. If so, decision 254 determines if an oblique seed is to be formed prior to the deposition of the shield. Regardless of the deposition process chosen in decision 254, step 256 forms the seed layer either with minimal morphology that corresponds to vapor deposited layers or with a predetermined morphologic direction and strength associated with oblique deposition from a particular angle.

With the seed layer formed in step 256, the shield layer is subsequently formed in step 258 with morphology that may or may not differ from that in the underlying seed layer. Next, decision 260 evaluates if a decoupling layer is to be obliquely deposited which advances the routine 250 to decision 262 where the stripe height of the decoupling layer is determined. The deposition process is then utilized to form a decoupling layer with a predetermined stripe height and morphology in step 264. It can be appreciated that as a result of step 264 a decoupling layer may be configured like layer 216 of FIG. 6 or like layer 140 of FIG. 2A, either of which are tuned to designated morphologic criteria with the selection of the deposition technique and layer thickness.

In the event a trilayer read element, or any other read element without a pinned magnetization in the stack, is utilized, a rear biasing magnet is to be formed to impart bias magnetization that sets default magnetizations in the magnetic stack. Decision 266 and subsequent step 268 determine the tuned characteristics of the biasing magnet and construct the component in accordance with predetermined criteria. The magnetic stack portion of the magnetic sensor is next designed with decisions 270 and 272 determining the number, material, order, sub-layer thicknesses, and morphology characteristics of a magnetic free layer, which are then executed into a laminated magnetic free layer in step 274.

While the routine 250 could terminate with a single magnetic free layer, decision 276 evaluates if a second free layer lamination is to be constructed. If so, a non-magnetic spacer layer is deposited in step 278 and the routine 250 returns to decision 270 where the second magnetic free layer is evaluated and the resultant design is implemented.

It can be appreciated that a wide variety of magnetic sensors can be constructed from the routine 250 that exhibit various structural and operational characteristics, such as varying anisotropy, morphology, thicknesses, and bias magnetization influence. However, the routine 250 is not limited only to the steps and decisions provided in FIG. 7 as any number of steps and determinations can be added, omitted, and modified to accommodate the fabrication of a precisely tuned magnetic sensor that utilizes varying morphology to provide enhanced magnetic data sensing. For example, decision 266 and the corresponding formation of the biasing magnet in step 268 can be performed subsequent to the construction of the stack, which may include multiple sub-layers separated by the spacer layer.

Further of note is that no particular deposition and formation processes are required to deposit the various layers in the routine 250. For example, atomic layer deposition can be used for some layers while vapor layer deposition can be utilized for other layers. Likewise, no oblique angle of deposition is required. Such an ability to use various formation processes can allow further ability to tune magnetic sensor fabrication with improved manufacturing efficiency and reliability.

It can be appreciated that the configuration and material characteristics of the magnetic sensor described in the present disclosure allows for enhanced data reading performance during application in ever-decreasing form factor data storage devices. The use of varying morphologies can increase magnetic stability in the various pinned and free magnetic layers of a magnetic sensor. Moreover, the ability to selectively tune the morphology by using sub-layers allows for precise control of magnetic sensor operation that corresponds with magnetizations optimized for particular environmental and operational behavior. In addition, while the embodiments have been directed to magnetic sensing, it will be appreciated that the claimed invention can readily be utilized in any number of other applications, including data storage device applications.

It is to be understood that even though numerous characteristics and configurations of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. An apparatus comprising:
 a decoupling layer with a decoupling morphology provided by first and second decoupling sub-layers each comprising a first common material and respectively having different thicknesses, morphology strengths, and morphology directions; and
 a magnetic free layer contactingly adjacent the decoupling layer and having a free morphology that differs from the decoupling morphology, the magnetic free layer configured with first and second magnetic free sub-layers each comprising a second common material and respectively having different thicknesses, anisotropy strengths, and anisotropy directions.

2. The apparatus of claim 1, wherein the first and second common materials are different.

3. The apparatus of claim 1, wherein the thicknesses of the first decoupling sub-layer and first free sub-layer are the same value.

4. The apparatus of claim 1, wherein the thicknesses of the first decoupling sub-layer and first free sub-layer are different values.

5. The apparatus of claim 1, wherein the thickness of the first decoupling sub-layer is 3 times greater than the thickness of the second decoupling sub-layer.

6. The apparatus of claim 1, wherein the decoupling layer is Tantalum.

7. The apparatus of claim 1, wherein the decoupling layer is MgO.

8. The apparatus of claim 1, wherein the first and second free sub-layers are each a CoFeB alloy.

9. The apparatus of claim 1, wherein the free morphology corresponds with the thicknesses, physical vapor deposition of the first magnetic free sub-layer, and oblique incidence sputtering deposition of the second magnetic free sub-layer, the decoupling morphology corresponds with the thicknesses, physical vapor deposition of the first decoupling free sub-layer, and oblique incidence sputtering deposition of the second decoupling sub-layer.

10. The apparatus of claim 1, wherein the anisotropy of the magnetic free layer is substantially in a cross-track direction, the cross-track direction being substantially parallel to an air bearing surface of the magnetic free layer.

11. A method comprising:
depositing a first decoupling sub-layer layer with a first thickness and common material with static oblique deposition from a first angle, the first decoupling sub-layer having a first morphology strength and direction;
forming a second decoupling sub-layer of the first common material with a second thickness atop the first decoupling sub-layer with vapor deposition, the first and second decoupling sub-layers collectively providing a decoupling layer with a decoupling morphology, the second decoupling sub-layer having a second morphology strength and direction that each differ from the first morphology strength and direction;
constructing a first magnetic free sub-layer of a second common material onto the decoupling layer with physical vapor deposition, the first magnetic free sub-layer having a third thickness, anisotropy strength, and anisotropy direction;
creating a second magnetic free sub-layer of the second common material atop the first magnetic free sub-layer with oblique deposition from a second angle, the second magnetic free sub-layer having a fourth thickness, anisotropy strength, and anisotropy direction that respectively differ from the third thickness, anisotropy strength, and anisotropy direction, the first and second magnetic free sub-layers collectively providing a free morphology that differs from the decoupling morphology.

12. The method of claim 11, wherein the first angle is different from the second angle.

13. The method of claim 11, wherein the first and second angles with respect to a substrate plane that is perpendicular to an air bearing surface of each magnetic free sub-layer.

14. The method of claim 11, further comprising annealing the first and second magnetic sub-layers to shift at least the free morphology a predetermined angular orientation.

15. A sensor comprising a magnetically responsive stack biased to a predetermined default magnetization by a biasing magnet, the magnetically responsive stack having at least first and second magnetic free layers separated by a non-magnetic spacer layer, at least one magnetic free layer contactingly adjacent a decoupling layer, the decoupling layer comprising first and second decoupling sub-layers each comprising a first common material and respectively having different thicknesses, morphology strengths, and morphology directions, that provide a decoupling morphology, the at least one magnetic free layer having first and second magnetic free sub-layers each comprising a second common material and respectively having different thicknesses, anisotropy strengths, and anisotropy directions that provide a free morphology that differs from the decoupling morphology.

16. The sensor of claim 15, wherein the first and second magnetic free layers separated by the non-magnetic spacer layer is characterized as a trilayer magnetic element with the predetermined default magnetization provided only by the biasing magnet.

17. The sensor of claim 15, wherein the decoupling morphology is tuned to correspond to a predetermined tunneling magnetoresistive ratio between the first and second magnetic free layers.

18. The sensor of claim 15, wherein the biasing magnet is formed on a seed layer comprising a third decoupling sub-layer comprising the second common material.

19. The sensor of claim 18, wherein the third decoupling sub-layer contacts the first decoupling sub-layer.

20. The sensor of claim 18, wherein the biasing magnet is configured with a bias morphology that is different than the decoupling and free morphologies.

* * * * *